(12) United States Patent
Koo et al.

(10) Patent No.: US 10,181,574 B2
(45) Date of Patent: Jan. 15, 2019

(54) ORGANIC LIGHT EMITTING DEVICE

(71) Applicant: LG Display Co., Ltd., Seoul (KR)

(72) Inventors: Wonhoe Koo, Goyang (KR); Sookang Kim, Paju (KR); Jihyang Jang, Goyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/593,029

(22) Filed: May 11, 2017

(65) Prior Publication Data

US 2018/0190932 A1      Jul. 5, 2018

(30) Foreign Application Priority Data

Dec. 29, 2016   (KR) .................... 10-2016-0182068

(51) Int. Cl.
*H01L 51/00* (2006.01)
*H01L 51/52* (2006.01)
*H01L 27/32* (2006.01)

(52) U.S. Cl.
CPC ........ *H01L 51/5209* (2013.01); *H01L 27/322* (2013.01); *H01L 27/3248* (2013.01); *H01L 27/3258* (2013.01); *H01L 27/3262* (2013.01); *H01L 51/5225* (2013.01); *H01L 51/5268* (2013.01); *H01L 2251/303* (2013.01); *H01L 2251/306* (2013.01); *H01L 2251/308* (2013.01); *H01L 2251/558* (2013.01)

(58) Field of Classification Search
CPC ............ H01L 51/5209; H01L 51/5225; H01L 27/322; H01L 27/3248; H01L 27/3258; H01L 27/3262; H01L 2251/303; H01L 2251/306; H01L 2251/308; H01L 2251/558

USPC .......................................................... 257/40
See application file for complete search history.

(56) References Cited

U.S. PATENT DOCUMENTS

| 4,774,435 A | 9/1988 | Levinson |
| 6,288,388 B1 | 9/2001 | Zhang et al. |
| 2002/0192576 A1* | 12/2002 | Matsuoka .............. G02B 5/201 430/7 |
| 2008/0024402 A1 | 1/2008 | Nishikawa et al. |
| 2008/0122347 A1* | 5/2008 | Lee ..................... H01L 27/3244 313/504 |
| 2008/0237764 A1* | 10/2008 | Kikuchi .............. H01L 27/1462 257/432 |
| 2010/0176717 A1 | 7/2010 | Lee et al. |

(Continued)

FOREIGN PATENT DOCUMENTS

EP       2 637 480 A1      9/2013

OTHER PUBLICATIONS

European Patent Office, Extended European Search Report and Opinion, EP Patent Application No. 17211029.8, dated May 25, 2018, eight pages.

*Primary Examiner* — Tu-Tu V Ho
(74) *Attorney, Agent, or Firm* — Fenwick & West LLP

(57) ABSTRACT

An exemplary embodiment may provide an organic light emitting diode that includes a first electrode including a concave part or a convex part, an organic light emitting layer disposed on the first electrode, and a second electrode disposed on the organic light emitting layer. Further, the exemplary embodiment may provide an organic light emitting device including the organic light emitting diode.

18 Claims, 15 Drawing Sheets

(56) References Cited

U.S. PATENT DOCUMENTS

| | | |
|---|---|---|
| 2012/0223314 A1* | 9/2012 | Marks ............... H01L 21/02554 |
| | | 257/66 |
| 2013/0082247 A1 | 4/2013 | Kawata et al. |
| 2013/0334507 A1* | 12/2013 | Shimoji ................... F21V 9/08 |
| | | 257/40 |
| 2015/0097191 A1 | 4/2015 | Chen |
| 2015/0179978 A1* | 6/2015 | Sato ................... H01L 51/5209 |
| | | 257/40 |
| 2015/0380466 A1 | 12/2015 | Koo et al. |
| 2016/0268351 A1 | 9/2016 | Wu |
| 2017/0062769 A1* | 3/2017 | Kim ................... H01L 27/3246 |
| 2017/0084676 A1* | 3/2017 | Jang ................... H01L 51/5209 |

\* cited by examiner

ORGANIC LIGHT EMITTING DEVICE

CROSS REFERENCE TO RELATED APPLICATION

This application claims priority from Korean Patent Application No. 10-2016-0182068, filed on Dec. 29, 2016 which is hereby incorporated by reference for all purposes as if fully set forth herein.

BACKGROUND OF THE INVENTION

1. Field of the Invention

The present disclosure relates to an organic light emitting diode and an organic light emitting device that emits light.

2. Description of the Prior Art

An organic light emitting device has advantages in that by using self-light emitting Organic Light Emitting Diodes (OLEDs), a response speed is high, a light emitting efficiency is high, a luminance is high, and a viewing angle is wide.

Light emitted from an organic light emitting layer of the organic light emitting device passes through various elements of the organic light emitting device, and is emitted from the organic light emitting device. However, some light, which is emitted from the organic light emitting layer, is confined inside the organic light emitting diode device, rather than being emitted from the organic light emitting device. Therefore, the light extraction efficiency of the organic light emitting device becomes an issue. A method of attaching a Micro Lens Array (MLA) to the outside of a substrate of the organic light emitting device has been used in order to improve the light extraction efficiency of the organic light emitting device.

SUMMARY OF THE INVENTION

In this background, an object of the present disclosure is to provide an organic light emitting diode and an organic light emitting device that improve an outward light emitting efficiency and reduce power consumption.

An exemplary embodiment may provide an organic light emitting diode that includes a first electrode including a concave part or a convex part, an organic light emitting layer disposed on the first electrode, and a second electrode disposed on the organic light emitting layer. Further, the exemplary embodiment may provide an organic light emitting device including the organic light emitting diode. The concave part or the convex part may include a concave bottom or a convex top, respectively, and one or more inclined side surfaces. In some embodiments, a first thickness of the organic light emitting layer adjacent to said one or more of the inclined side surfaces is thinner than a second thickness of the organic light emitting layer adjacent to the concave bottom or the convex top.

According to the present exemplary embodiment as described above, it is possible to provide an organic light emitting diode and an organic light emitting device that can improve an external light emitting efficiency and can reduce power consumption.

BRIEF DESCRIPTION OF THE DRAWINGS

The above and other objects, features, and advantages of the present disclosure will be more apparent from the following detailed description taken in conjunction with the accompanying drawings, in which.

DETAILED DESCRIPTION OF THE EXEMPLARY EMBODIMENTS

Figure 1:
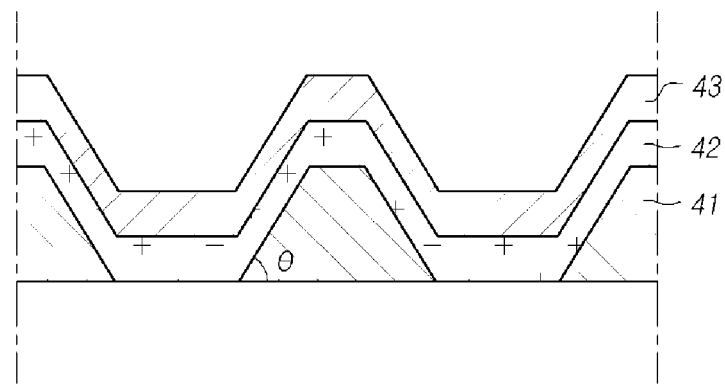
FIG. 1 is a cross-sectional view of an organic light emitting diode according to one exemplary embodiment.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a cross-sectional view of an organic light emitting diode according to one exemplary embodiment.

Referring to FIG. 1, an organic light emitting diode 10 includes a first electrode 41 including a concave part or a convex part, an organic light emitting layer 42 disposed on the first electrode 41, and a second electrode 43 disposed on the organic light emitting layer 42.

Detailed descriptions of a structure and a shape of the organic light emitting diode 10 will be made later with reference to FIGS. 3A, 3B, and 10.

Figure 2:
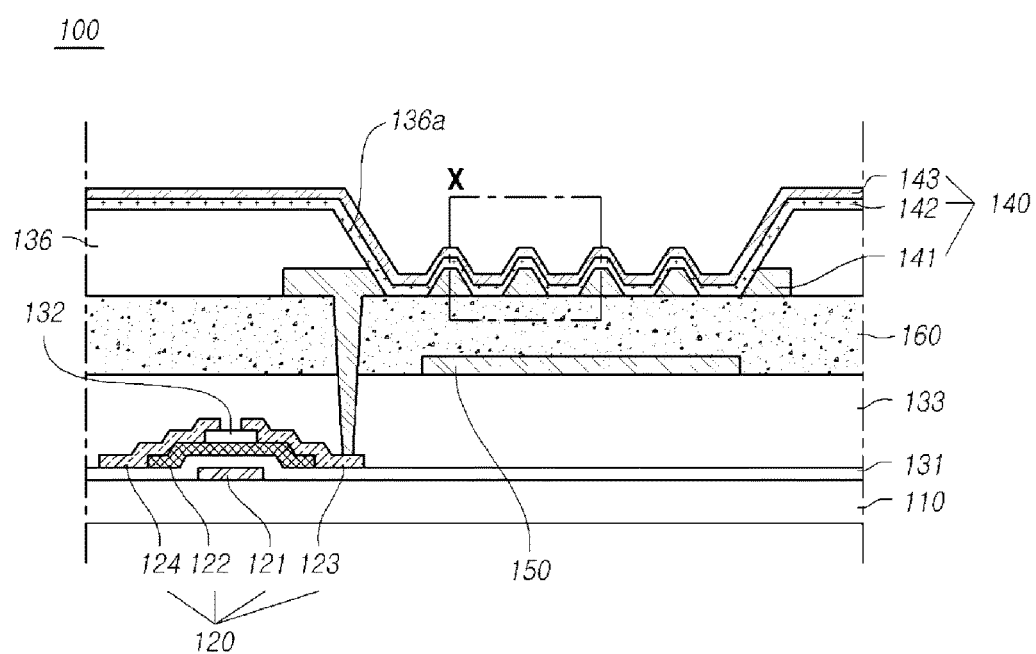
FIG. 2 is a cross-sectional view of an organic light emitting device according to one exemplary embodiment.

FIG. 2 is a cross-sectional view of an organic light emitting device according to one exemplary embodiment. FIG. 3A is an enlarged cross-sectional view for the region "X" in FIG. 2. FIG. 3B illustrates a plan view of the first electrode of FIG. 2 and an enlarged sectional view of the region "X" of FIG. 2, which corresponds to the planar structure of the first electrode.

Referring to FIG. 2, an organic light emitting device 100 according to an exemplary embodiment may be any of various light emitting devices that include an organic light emitting diode or an organic electric element including two electrodes and an organic layer between the two electrodes.

The organic light emitting device 100 may be one of an organic light emitting display device that displays an image, a lighting device, and a light source. For example, when the organic light emitting device 100 is an organic light emitting diode display device, it may be, but not exclusively, at least one of a bottom emission display device, a top emission display device, a dual emission display device, a flexible display device, and a transparent display device.

When the organic light emitting device 100 is a lighting device, it may be an indoor or outdoor lighting device, a vehicular lighting device, or the like, or may be combined with another mechanical member to be applied to the above-described lighting devices. For example, the vehicular lighting device may be, but not exclusively, at least one of a head lamp, a high beam lamp, a tail lamp, a brake lamp, a back light, a stop lamp, a fog lamp, a turn signal light, and an auxiliary lamp.

When the organic light emitting device 100 is a light source, it may be efficiently applied to, for example: a light source of a backlight of a Liquid Crystal Display (LCD), various lighting sensors, a printer, or a copying machine; a light source of a vehicle instrument; a light source of a signal lamp, a sign lamp, or a surface light emitting body; a decoration; various lights; or the like.

Hereinafter, descriptions will be made assuming that the organic light emitting device 100 is an organic light emitting diode display device. However, without being limited thereto, the organic light emitting device 100 may be a lighting device or a light source.

Figure 3A:
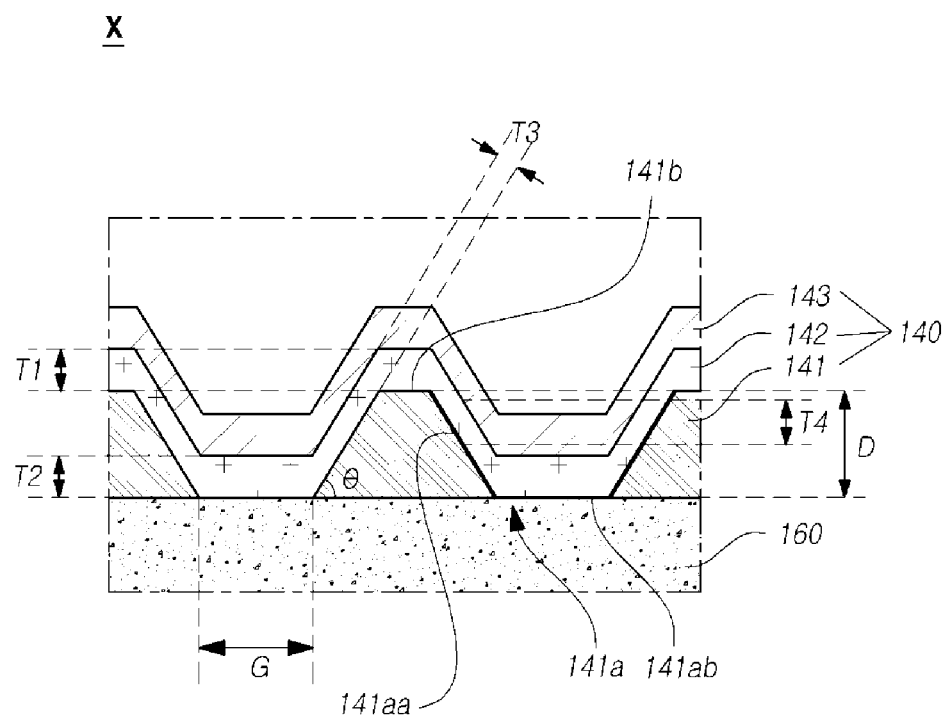
FIG. 3A is an enlarged cross-sectional view for the region "X" in FIG. 2.

Referring to FIGS. 2 and 3A, the organic light emitting device 100 is illustrated as including a substrate 110, a thin film transistor 120, a color filter 150, a third insulation layer 160, and an organic light emitting diode 140, but is not limited thereto. For example, the organic light emitting device 100 according to an exemplary embodiment may be an organic light emitting device including an organic light emitting diode 140 on the substrate 110, and may be an organic light emitting device including a third insulation layer 160 on the substrate 110, and an organic light emitting diode 140 on the third insulation layer 160.

As illustrated in FIGS. 2 and 3A, the third insulation layer 160 may be disposed under the first electrode 141 of the organic light emitting diode 140, and may be a flat insulation layer.

The organic light emitting device 100 illustrated in FIGS. 2 and 3A is a bottom emission type organic light emitting device. However, the organic light emitting device 100 according to an exemplary embodiment may be a top emission type organic light emitting device.

On the substrate 110, the thin film transistor 120 is disposed, which includes a gate electrode 121, an active layer 122, a source electrode 123, and a drain electrode 124.

More specifically, the gate electrode 121 is disposed on the substrate 110, a first insulation layer 131 for insulating the gate electrode 121 and the active layer 122 is formed on the gate electrode 121 and the substrate 110, and the active layer 122 is disposed on the first insulation layer 131. Further, an etch stopper 132 is disposed on the active layer 122, and the source electrode 123 and the drain electrode 124 are disposed on the active layer 122 and the etch stopper 132. The source electrode 123 and the drain electrode 124 are electrically connected with the active layer 122 in a manner of being in contact with the active layer 122, and are disposed on a partial region of the etch stopper 132. In some embodiments, the etch stopper 132 may not be provided.

In this specification, among various thin film transistors, which may be included in the organic light emitting device 100, only a driving thin film transistor is illustrated for the convenience of description. In addition, in this specification, descriptions will be made assuming that the thin film transistor 120 has a bottom gate structure or an inverted staggered structure in which the gate electrode 121 is located on the opposite side of the source electrode 123 and the drain electrode 124 with reference to the active layer 122. However, in other embodiments a thin film transistor 120 having a coplanar structure or a top gate structure may also be used, in which the gate electrode 121 is positioned at the same side as the source electrode 123 and the drain electrode 124 with reference to the active layer 122.

A second insulation layer 133 is disposed on the thin film transistor 120, and a color filter 150 is disposed on the second insulation layer 133.

Although FIG. 2 illustrates that the second insulation layer 133 flattens the top portion of the thin film transistor 120, the second insulation layer 133 may be disposed following the surface shapes of the elements positioned therebelow, rather than flattening the top portion of the thin film transistor 120.

The color filter 150 is configured to convert the color of light emitted from the organic light emitting layer 142, and may be one of, for example, a red color filter, a green color filter, and a blue color filter.

The color filter 150 is disposed on the second insulation layer 133 at a position corresponding to a light emitting region. Here, the light emitting region means a region where the organic light emitting layer 142 emits light by the first electrode 141 and the second electrode 143. Further, the description "the color filter 150 is disposed at a position corresponding to the light emitting region" means that the color filter 150 is disposed to prevent blurring and ghost phenomena from occurring due to a mutual mixing of lights emitted from neighboring light emitting regions.

For example, the color filter 150 is arranged to be superimposed on the light emitting region. More specifically, the color filter 150 may have a size that is smaller than the light emitting region. However, the disposed position and size of the color filter 150 may be determined by various factors, such as a distance between the color filter 150 and the first electrode 141 and a distance between the color filter 150 and the third insulation layer 160 and a distance between a light emitting region and a non-light emitting region, in addition to the size and position of the light emitting region.

The third insulation layer 160 is disposed on the color filter 150 and the second insulation layer 133. Although FIG. 2 illustrates that the second insulation layer 133 is included in the organic light emitting device 100, in other embodiments the third insulation layer 160 may be directly disposed on the thin film transistor 120 without using the second insulation layer 133. Although FIG. 2 illustrates that the color filter 150 is disposed on the second insulation layer 133, the color filter 150 may be disposed at any position between the third insulation layer 160 and the substrate 110 without being limited thereto.

A bank layer 136 and the organic light emitting diode 140 including the first electrode 141, the organic light emitting layer 142, and the second electrode 143 are disposed on the third insulation layer 160. At this time, although not illustrated, an insulative second insulation layer (not illustrated), which has a refractive index similar to that of the first electrode 141, may be added between the third insulation layer 160 and the first electrode 141 to block outgassing from the third insulation layer 160 from spreading to the organic light emitting diode 140.

Specifically, the first electrode 141 is disposed on the third insulation layer 160 to supply electrons or holes to the organic light emitting layer 142. The first electrode 141 may be a positive pole, a pixel electrode, or an anode in a normal organic light emitting diode (OLED), and may be a negative pole, a pixel electrode, or a cathode in an inverted OLED.

The first electrode 141 may be connected to the source electrode 123 of the thin film transistor 120 through contact holes formed in the third insulation layer 160 and the second insulation layer 133. Herein, it has been described that the first electrode 141 is connected to the source electrode 123 on the assumption that the thin film transistor 120 is an N-type thin film transistor. However, when the thin film transistor 120 is a P-type thin film transistor, the first electrode 141 may be connected to the drain electrode 124. The first electrode 141 may be directly in contact with the organic light emitting layer 142, or may be in contact with the organic light emitting layer 142 with a conductive material being interposed therebetween so that the first electrode 141 can be electrically connected to the organic light emitting layer 142.

The first electrode 141 may be a single layer, but may be a multilayer including two or more layers.

Referring to FIG. 3A, the first electrode 141 includes concave parts 141a and a first connection part 141b connecting neighboring concave parts 141a. The first electrode 141 functions as a flattening layer in a part where no concave part 141a is disposed, that is, in the first connecting part 141b.

Referring to FIG. 3A, although it is illustrated that a plurality of concave parts 141a are provided, for example, a single concave part 141a may be provided without being limited thereto.

Figure 4:
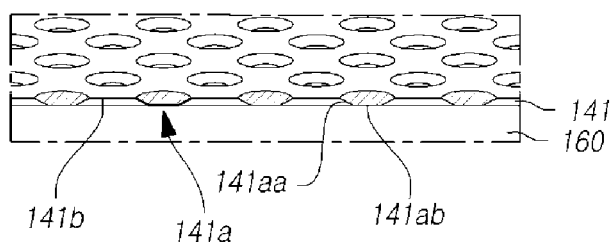
FIG. 4 is a partial perspective view illustrating the third insulation layer and the first electrode of FIG. 2 in which an end surface is partially cut away.

FIG. 4 is a partial perspective view illustrating the third insulation layer and the first electrode of FIG. 2 partially in cross section.

Figure 3B:
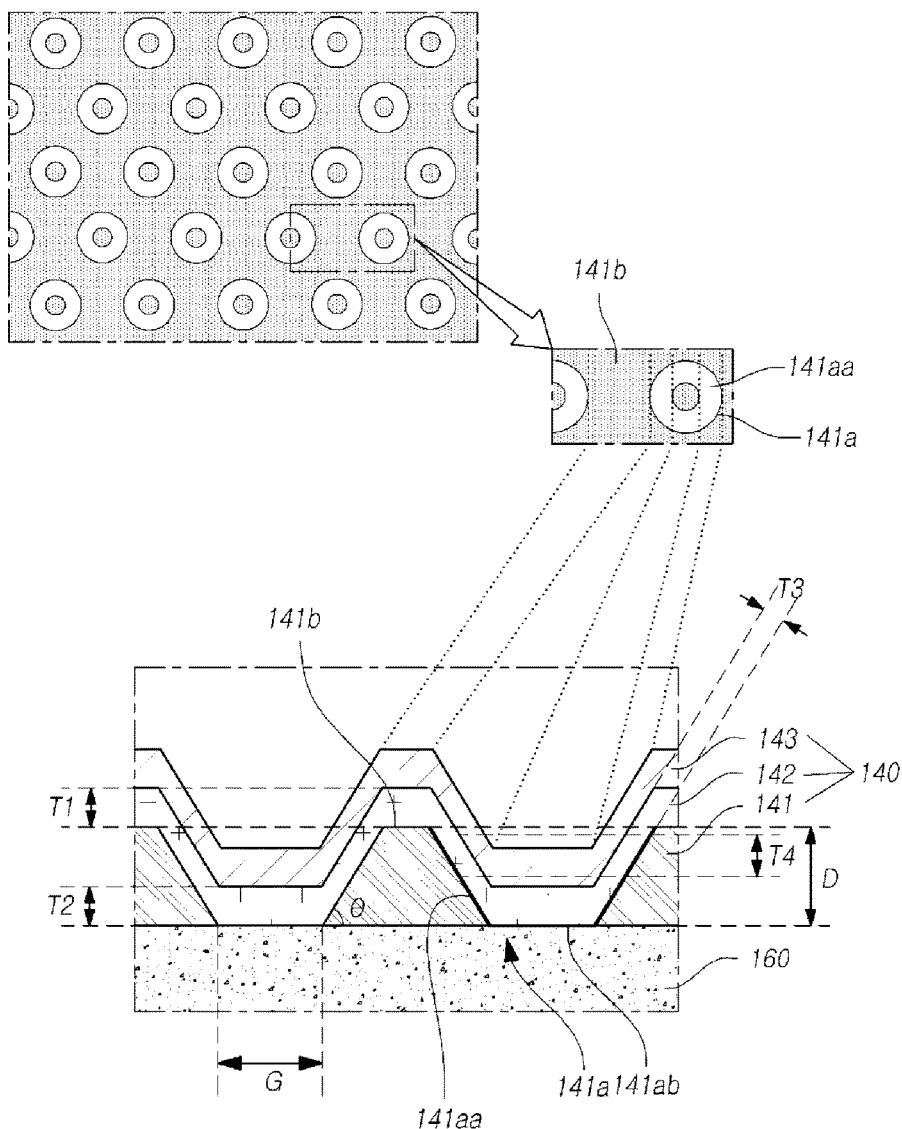
FIG. 3B illustrates a plan view of the first electrode of FIG. 2 and an enlarged sectional view of the region "X" of FIG. 2, which corresponds to the planar structure of the first electrode.

Referring to FIG. 3B and FIG. 4, the concave part 141a has a shape inclined to be narrowed downward. The concave part 141a may have a constant taper shape. For example, the cross-sectional shape of the concave part 141a may be a trapezoidal shape, but is not limited thereto.

The inclination θ of the inclined surface 141aa of the concave part 141a means an angle formed by the inclined surface 141aa of the concave part 141a and the bottom surface of the first electrode 141, and the inclination θ may be an acute angle.

FIG. 3B illustrates that the inclined surface 141aa of the concave part 141a is linear in a cross section, and FIG. 4 illustrates that the inclined surface 141aa of the concave part 141a is flat. However, the inclined surface 141aa of the concave part 141a may be generally linear or planar, although it may include a non-linear or curved surface in a cross section.

The inclination θ of the inclined surface 141aa of the concave part 141a may be 15 to 70 degrees. When the inclination θ of the inclined surface 141aa of the concave part 141a has a small angle of less than 15 degrees, the light extraction efficiency may be weak. When the inclination θ of the inclined surface 141aa has a large angle of more than 70 degrees, the traveling angle of light, which starts to travel from an effective light emitting region, may be 42 degrees or more. Consequently, the light may be confined again inside the organic light emitting diode 140 and the light emitting efficiency may not be increased.

Referring to FIGS. 3A and 3B, although it is illustrated that an interval is present in a case where a separation distance G (gap) in the bottom 141ab of the concave part 141a is larger than 0, the separation distance G (gap), which is the interval between two neighboring concave parts 141a in the bottoms 141ab of the concave parts 141a, may be zero (i.e., two neighboring concave parts 141 may be adjacent to each other without a gap G), as will be described later with reference to FIG. 8A.

As illustrated in FIGS. 3B and 4, the concave parts 141a may have a circular shape as a whole in a plan view. However, without being limited thereto, the concave parts 141a may have various shapes, such as a hemispherical shape, a semi-ellipsoidal shape, a square shape, and a hexagonal shape.

The shape of the concave parts 141a of the first electrode 141 is formed through the processes, such as photolithography, wet etching, and dry etching. In this case, the morphology of the concave parts 141a of the first electrode 141 can be adjusted when a heat treatment process performed at this time is adjusted.

In terms of material, the first electrode 141 may include an amorphous metal oxide. For example, the amorphous metal oxide may include any one selected from a group consisting of Indium Zinc Oxide (IZO), Zinc Tin Oxide (ZTO), SnO2 (tin oxide), ZnO (zinc oxide), In2O3 (indium oxide), Gallium Indium Tin Oxide (GITO), Indium Gallium Zinc Oxide (IGZO), Zinc Indium Tin Oxide (ZITO), Indium Gallium Oxide (IGO), Ga2O3 (gallium oxide), Aluminum Zinc Oxide (AZO) and Gallium Zinc Oxide (GZO).

When the first electrode 141 includes the amorphous metal oxide, it may be suitable for forming the concave portion 141a of the first electrode 141 to the three-dimensionally constant taper shape through processes such as photolithography, wet etching, and dry etching. In terms of material-process relationship, it is possible to form the concave portion 141a of the first electrode 141 to a three-dimensionally reverse taper shape if the material of the first electrode 141 is selected incorrectly.

A bank layer 136 is disposed on the third insulation layer 160 and the first electrode 141, and the bank layer 136 includes an opening 136a that exposes the first electrode 141. The bank layer 136 serves to separate neighboring pixels (or sub-pixels) regions, and may be disposed between neighboring pixel (or sub-pixel) regions. The concave parts 141a and the first connection part 141b of the first electrode 141 are disposed to be superimposed on the opening 136a of the bank layer 136.

The organic light emitting layer 142 is disposed on the first electrode 141, and the second electrode 143 is disposed on the organic light emitting layer 142 to supply electrons or holes to the organic light emitting layer 142. The organic light emitting layer 142 is disposed in a tandem white structure in which a plurality of organic light emitting layers are stacked in order to emit white light. The organic light emitting layer 142 may include a first organic light emitting layer that emits blue light and a second organic light emitting layer that is disposed on the first organic light emitting layer and emits light having a color that becomes white when mixed with blue. The second organic light emitting layer may be an organic light emitting layer that emits, for example, yellow green light. In the meantime, the organic light emitting layer 142 may only include an organic light emitting layer that emits one of blue light, red light, and green light. In this case, the color filter 150 may not be included. The second electrode 143 may be a negative pole, a common electrode, or a cathode in a normal organic light emitting diode (OLED), and may be a positive pole, a common electrode, or an anode in an inverted OLED.

The organic light emitting layer 142 and the second electrode 143 are disposed in a shape that follows the morphology of the top surface of the first electrode 141. Accordingly, the organic light emitting layer 142 and the second electrode 143 have a concave morphology in the concave parts 141a of the first electrode 141. Consequently, the shape of the organic light emitting diode 140 may be implemented using the concave parts 141a of the first electrode 141.

The thickness of the organic light emitting layer 142, which is in a direction perpendicular to the first electrode 141, may be relatively thin in a region corresponding to the inclined surface 141aa of each concave part 141a, and may be thinner than the part of the thickness of the organic light emitting layer 142 adjacent to the bottom 141ab of the concave part 141a or the first connection part 141b of the first electrode 141.

For example, when the organic light emitting layer 142 is formed through a vapor deposition process, the thicknesses T1, T2, and T4 of the organic light emitting layer 142 deposited in a direction perpendicular to the substrate 110 are the same as each other. However, due to the characteristics of the vapor deposition process, the thickness T3 of the organic light emitting layer 142 driving a current between the practical first and second electrodes 141 and 143 in the vertical direction on the inclined surface of the organic light emitting layer 142 becomes relatively thin. The thicknesses T1 and T2 of the organic light emitting layer 142 driving a current between the first electrode 141 and the second electrode 143 are relatively thick in the bottom 141ab of the concave part 141a and the first connection part 141b.

The thickness T3 of the organic light emitting layer 142, which is perpendicular to the first electrode 141 in the region corresponding to the inclined surface 141aa of each concave part 141a, is reduced as the inclination θ of the inclined surface 141aa of the concave part 141a is increased. The thickness T3 of the organic light emitting layer 142, which is perpendicular to the first electrode 141 in the region corresponding to the inclined surface 141aa of each concave part 141a, and the inclination θ of the inclined surface 141aa of the concave part 141a are determined according to Equation 1 as follows.

$$T3 = T1 * \cos\theta = T2 * \cos\theta = T4 * \cos\theta \quad \text{Equation 1}$$

As described above, the thickness of the organic light emitting layer 142 in a region corresponding to the inclined surface 141aa of each concave part 141a may be relatively thinner than the part of the thickness of the organic light emitting layer 142 adjacent to the bottom 141ab of the concave part 141a or the first connection part 141b of the first electrode 141.

The thickness of the organic light emitting layer 142 in a region corresponding to the inclined surface 141aa of each concave part 141a being relatively thin may result in an efficient light emitting region in which electric fields are locally concentrated. When the organic light emitting diode 140 is driven, electric fields are locally concentrated in the efficient light emitting region, and a main current path is formed to generate the main light emission.

In one embodiment, T3 is a value of T1 reduced by 15%-50%, T2 reduced by 15%-50%, or T4 reduced by 15%-50%. When T3 is T1 (or T2, or T4) reduced by less than 15%, light emission quantity is not enhanced significantly. On the other hand, when T3 is T1 (or T2, or T4) reduced by more than 50%, light emission quantity may be significantly enhanced but the organic light emitting layer 142 is so thin that the life of the organic light emitting device 100 may be deteriorated. Therefore, the organic light emitting layer 142 is made to have a thickness of T3 thinner than T1 or T2 or T4 by a modest amount (i.e., T1 or T2 or T4 reduced by 15%-50%) to achieve enhancement of light emission and life of the organic light emitting device at the same time.

In view of the light emission quantity of the organic light emitting layer 142 depending on the thicknesses (T1, T2, T3, etc.) of the organic light emitting layer 142, which is perpendicular to the first electrode 141, the light emission quantity per unit area of the organic light emitting layer 142 in the inclined surface 141aa between the bottom 141ab of the concave part 141a and the first connection part 141b of the first electrode 141 may be larger than the light emission quantity per unit area of the organic light emitting layer 142 in the bottom 141ab of the concave part 141a or the first connection part 141b.

Figure 5:
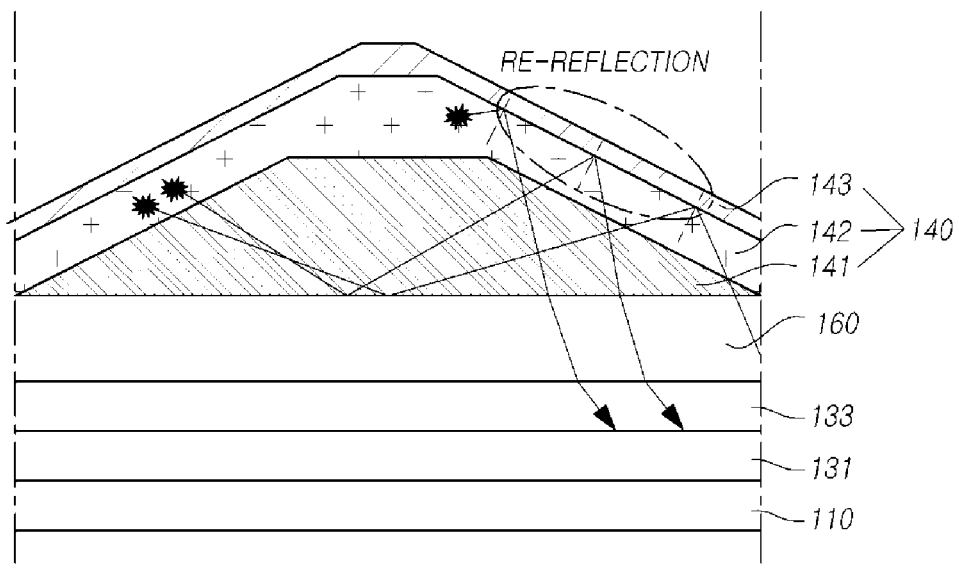
FIG. 5 is an enlarged cross-sectional view of a part of the region "X" in FIG. 2, illustrating optical paths of light emitted from an organic light emitting layer.

FIG. 5 is an enlarged cross-sectional view of a part of the region "X" in FIG. 2, illustrating optical paths of light emitted from an organic light emitting layer.

Referring to FIG. 5, the light emitted from the organic light emitting layer 142, which is confined by being totally reflected in the first electrode 141 and the organic light emitting layer 142, is extracted to the outside by being re-reflected from the second electrode 143 positioned to correspond to the inclined surface 141aa by the concave structure of the first electrode 141, so that outward light emitting efficiency can be improved.

Figure 6:
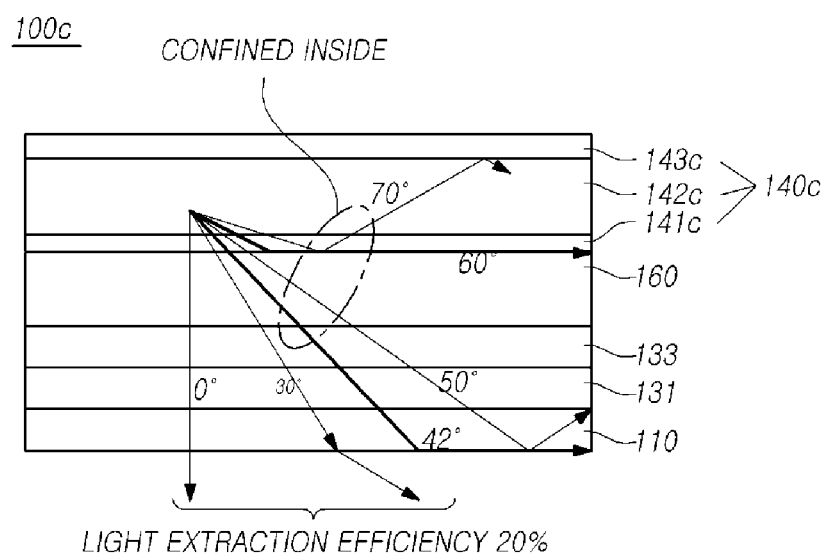
FIG. 6 is a view illustrating optical paths of light emitted from an organic light emitting device according to a comparative example.

FIG. 6 is a view illustrating optical paths of light emitted from an organic light emitting device according to a comparative example.

Referring to FIG. 6, the organic light emitting device 100c according to the comparative example includes a first insulation layer 131, a second insulation layer 133, and a third insulation layer 160 on a substrate 110. Unlike the organic light emitting device 100 according to the exemplary embodiment illustrated in FIG. 3A, the organic light emitting device 100c according to the comparative example includes, on a third insulation layer 160, an organic light emitting diode 140c that includes a flat first electrode 141c, an organic light emitting layer 142c, and a second electrode 143c.

Approximately 80% of light emitted from the organic light emitting layer 142c is confined inside the organic light emitting device 100c, and only 20% of light is extracted to the outside. Therefore, there is a problem in that the optical efficiency of the organic light emitting device 100c is very low.

Figure 7:
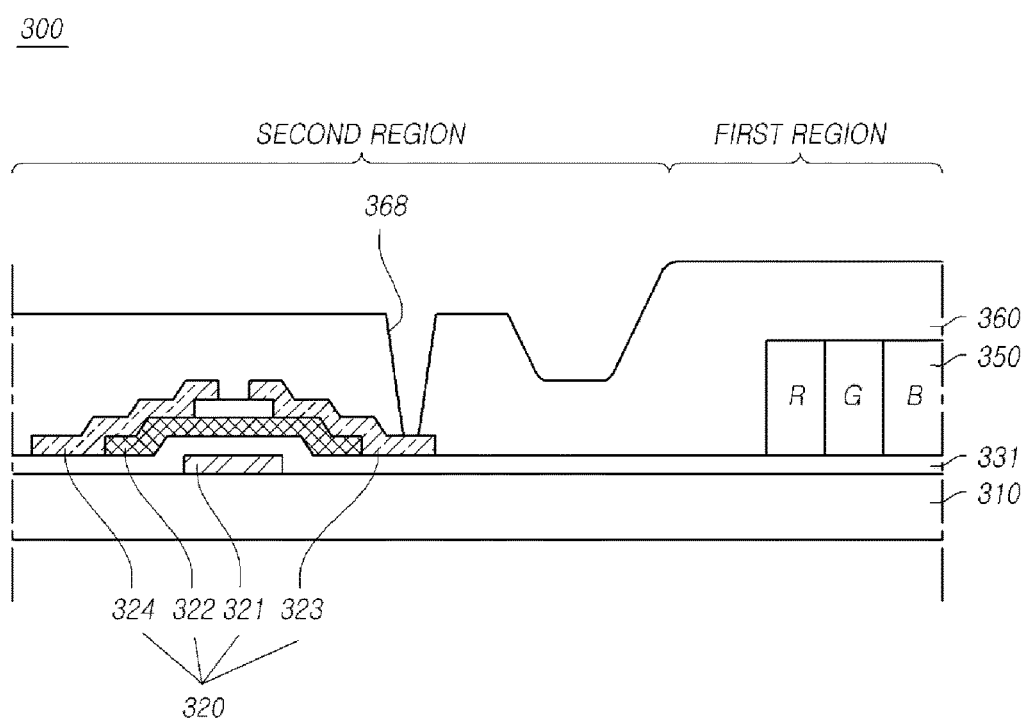
FIG. 7 is a cross-sectional view of an organic light emitting device including a thin film transistor according to another exemplary embodiment before a first electrode is formed in the organic light emitting device.

FIG. 7 is a cross-sectional view of an organic light emitting device including a thin film transistor according to another exemplary embodiment before a first electrode is formed in the organic light emitting device.

Referring to FIG. 7, in a manufacturing process of an organic light emitting device 300 including a thin film transistor according to another exemplary embodiment, a thin film transistor 320, which includes a gate electrode 321, an active layer 322, a source electrode 323, and a drain electrode 324, is formed on a substrate 310. A gate insulating layer 331 may be located between the gate electrode 321 and the active layer 322.

Thereafter, a second insulation layer (not shown), a color filter 350, and a third insulation layer 360 are formed on the thin film transistor 320 similarly to the description in FIG. 2.

When the third insulation layer 360 is formed, as illustrated in FIG. 7, only the second region corresponding to the thin film transistor 320 may be patterned so as to reduce the thickness of a first electrode contact hole 368 and the third insulating layer 360 in the third insulating layer 360, and the first region corresponding to the color filter 350 may not be patterned. Thus, the patterning process of the third insulation layer 360 can be simplified.

Figure 8A:
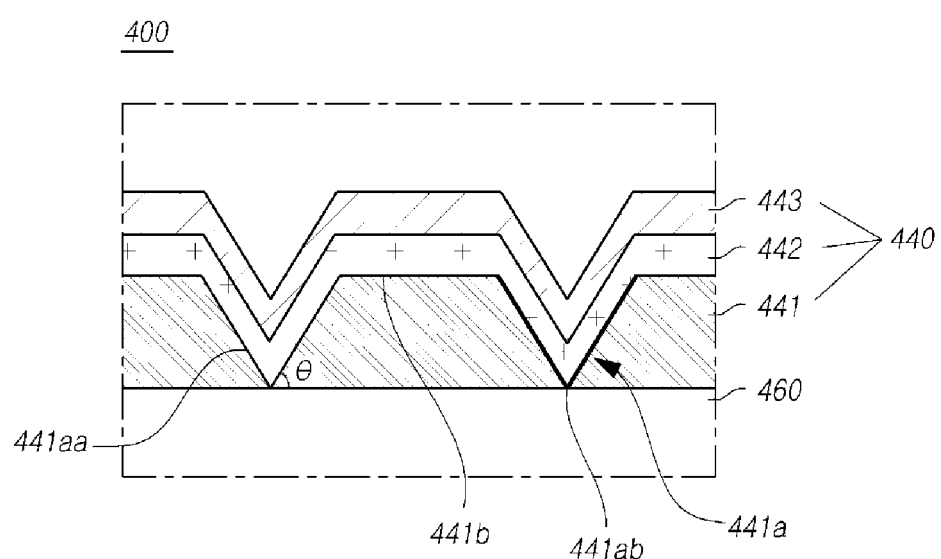
FIGS. 8A and 8B are enlarged sectional views of an organic light emitting device according to still another exemplary embodiment.
Figure 8B:
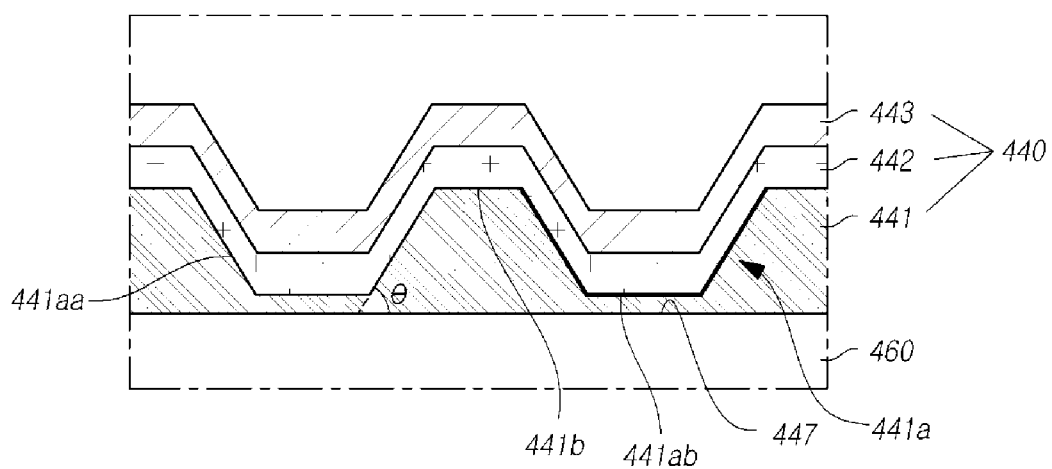

FIGS. 8A and 8B are enlarged sectional views of an organic light emitting device according to still another exemplary embodiment.

Referring to FIGS. 8A and 8B, an organic light emitting device 400 according to still another exemplary embodiment includes, on a third insulation layer 460, a first electrode 441 that includes concave parts 441a and a first connection layer 441b that connects neighboring concave parts 441a, and an organic light emitting layer 442 and a second electrode 443 that are arranged in a shape following the morphology of the top surface of the first electrode 441.

As illustrated above, the shape of the concave parts 441a of the first electrode 441 is formed through the processes, such as photolithography, wet etching, and dry etching. In this case, the morphology of the concave parts 441a of the first electrode 441 can be adjusted when a heat treatment process performed at this time is adjusted.

Referring to FIG. 8A, a separation distance G (gap) in the bottom 441ab of each concave part 441a may be 0, and when the separation distance G (gap) is 0, an effective light emitting region may be increased so that light emitting efficiency is increased.

The separation distance G (gap) in the bottom 441ab of the concave part 441a may be made to zero (0) by adjusting the heat treatment and etching time during the patterning process of the concave part 441a in the first electrode 441.

Referring to FIG. 8B, when the separation distance G (gap) in the bottom 441ab of each concave part 441a is larger than 0 and an interval is present, the first electrode 441 may include a horizontal extension 447 to the outside of an inclined surface 441aa in the bottom 441ab of the concave part 441a.

Figure 9:
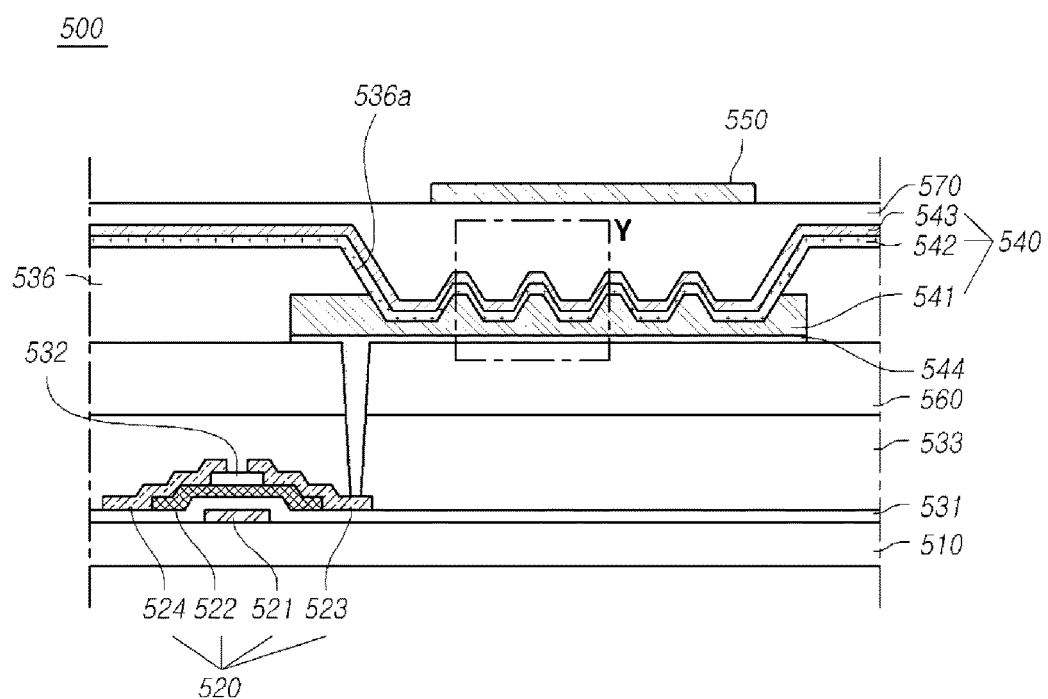
FIG. 9 is a cross-sectional view of an organic light emitting device according to still another exemplary embodiment.

FIG. 9 is a cross-sectional view of an organic light emitting device according to still another exemplary embodiment.

Referring to FIG. 9, although an organic light emitting device 500 according to still another exemplary embodiment is described as a top emission type organic light emitting device in which a color filter 550 is located at the opposite side to the substrate 510, the organic light emitting device 500 may be a bottom emission type organic light emitting device in which a color filter 550 is located on the substrate 510 side. The top emission type organic light emitting device 500 has an advantage advantageous in life span and luminance because the aperture ratio is increased compared with the bottom emission type organic light emitting device.

An organic light emitting device 500 according to still another exemplary embodiment is different from the bottom emission type organic light emitting device 100 of FIGS. 2 and 3A in that the organic light emitting device 500 includes a reflection plate 544 below the first electrode 541, includes an adhesive layer 570 between the second electrode 543 and the color filter 550, and the first electrode 541 includes a convex part 541c, and the other elements are substantially the same as the bottom emission type organic light emitting device 100. Thus, redundant descriptions will be omitted. The elements of the organic light emitting device 500, which are not illustrated in FIG. 9, may be similar to the elements of the bottom emission type organic light emitting device 100 according to the above-described exemplary embodiments.

A reflection plate 544 made of, for example, a conductive material may be disposed under the first electrode 541. The reflection plate 544 may reflect light emitted from the organic light emitting layer 542 to improve top emission efficiency. When the first electrode 541 itself functions as the reflection plate, the reflection plate 544 may not be separately provided below the first electrode 541.

The reflection plate 544 and the first electrode 541 may be connected to the source electrode 523 of the thin film transistor 520 through a contact hole formed in the third insulation layer 560. Herein, it has been described that the first electrode 541 is connected to the source electrode 523 on the assumption that the thin film transistor 520 is an N-type thin film transistor. However, when the thin film transistor 520 is a P-type thin film transistor, the reflection plate 544 and the first electrode 541 may be connected to the drain electrode 524. The first electrode 541 may be directly in contact with the organic light emitting layer 542, or may be in contact with the organic light emitting layer 542 with a conductive material being interposed therebetween so that the first electrode 541 can be electrically connected to the organic light emitting layer 542.

Figure 10:
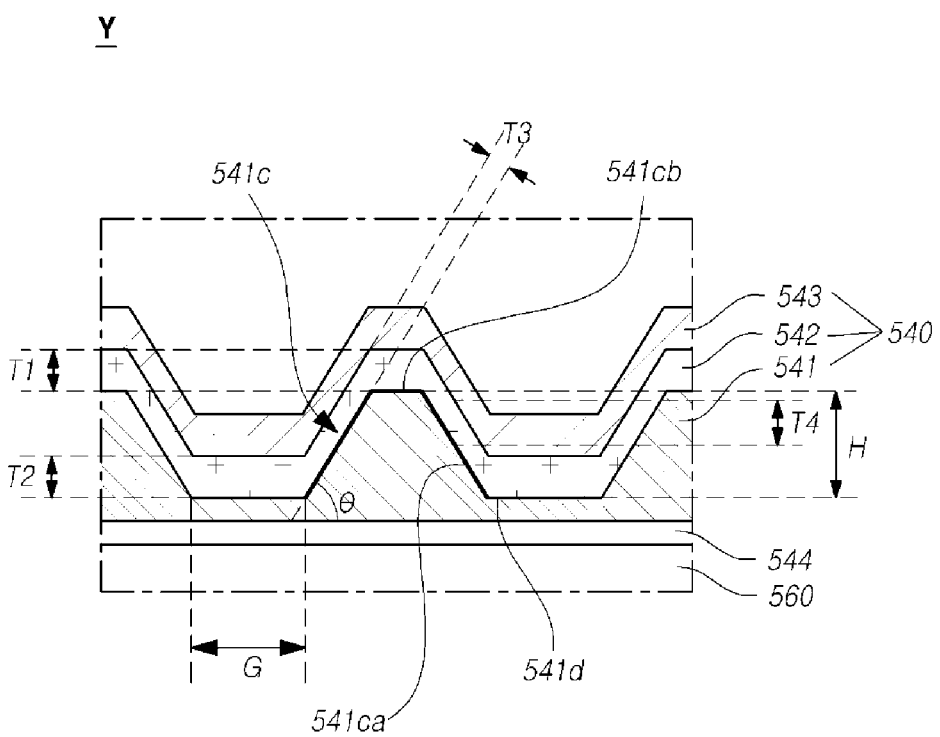
FIG. 10 is an enlarged cross-sectional view for the region "Y" in FIG. 9.

FIG. 10 is an enlarged cross-sectional view for the region "Y" in FIG. 9.

Referring to FIG. 10, the first electrode 541 includes convex parts 541c and a second connection part 541d that connects neighboring convex parts 541c. The first electrode 541 functions as a flattening layer in a portion where no convex part 541c is disposed.

Referring to FIG. 10, although it is illustrated that a plurality of convex parts 541c are provided, for example, a single convex part 541c may be provided without being limited thereto.

Figure 11:
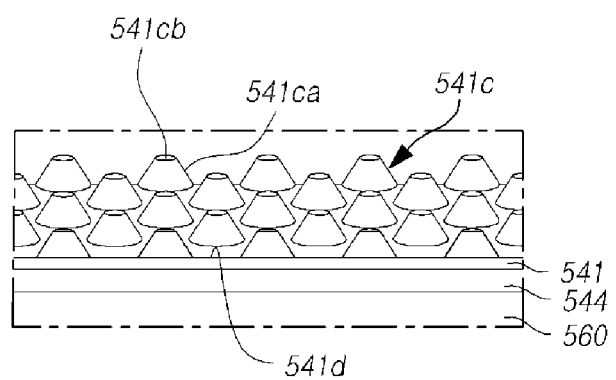
FIG. 11 is a partial perspective view illustrating the third insulation layer, the reflection plate, and the first electrode of FIG. 9 in which an end surface is partially cut away.

FIG. 11 is a partial perspective view illustrating the third insulation layer, the reflection plate, and the first electrode of FIG. 9 partially in cross section.

The convex parts 541c have a positive-tapered shape that is narrowly inclined upward. For example, the cross-sectional shape of the convex parts 541c may be a trapezoidal shape, but is not limited thereto. The convex parts 541c may have a truncated conical shape, but may be a polyhedron, such as a partially cut hexahedron or tetrahedron.

The inclination θ of the inclined surface 541ca of the convex part 541c means an angle formed by the inclined surface 541ca of the convex part 541c and the bottom surface of the first electrode 541, and the inclination θ may be an acute angle.

The inclination θ of the inclined surface 541ca of the convex part 541c may be 15 to 70 degrees. When the inclination θ of the inclined surface 541ca of the convex part 541c has a small angle of less than 15 degrees, the light extraction efficiency may be weak. When the inclination θ of the inclined surface 541ca is a large angle of more than 70 degrees, the traveling angle of light, which starts to travel from an effective light emitting region, may be 42 degrees or more. Consequently, the light may be confined again inside the organic light emitting diode 540 and the light emitting efficiency may not be increased.

Although it is illustrated that an interval is present in a case where the separation distance G (gap) in the second connection portion 541d is larger than 0, the separation distance G (gap) may be zero.

In terms of material, the first electrode 541 may include an amorphous metal oxide, as described above.

The organic light emitting layer 542 and the second electrode 543 is disposed in a shape that follows the morphology of the top surface of the first electrode 541. Accordingly, the organic light emitting layer 542 and the second electrode 543 have a convex morphology in the convex parts 541c of the first electrode 541. Consequently, the shape of the organic light emitting diode 540 may be implemented using the convex parts 541c of the first electrode 541.

Referring to FIG. 10, the thickness of the organic light emitting layer 542, which is perpendicular to the first electrode 541, may be relatively thin in a region corresponding to the inclined surface 541ca of each convex part 541c, and may be thinner than the thickness of the organic light emitting layer 542 in the top 541cb of the convex part 541c or the second connection part 541d of the first electrode 541.

For example, when the organic light emitting layer 542 is formed through a vapor deposition process, the thicknesses T1, T2, and T4 of the organic light emitting layer 542 deposited in a direction perpendicular to the substrate 510 are the same as each other. However, due to the characteristics of the vapor deposition process, the thickness T3 of the organic light emitting layer 542 driving a current between the practical first and second electrodes 541 and 543 in the vertical direction on the inclined surface of the organic light emitting layer 542 becomes relatively thin. The thicknesses T1 and T2 of the organic light emitting layer 542 driving a current between the first electrode 541 and the second electrode 543 are relatively thick in the top 541cb of the convex part 541c and the second connection part 541d.

The thickness T3 of the organic light emitting layer 542, which is perpendicular to the first electrode 541 in the region corresponding to the inclined surface 541ca, is reduced as the inclination θ of the inclined surface 541ca of the convex part 541c is increased. The thickness T3 of the organic light emitting layer 542, which is perpendicular to the first electrode 541 in the region corresponding to the inclined surface 541ca, and the inclination θ of the inclined surface 541ca of the convex part 541c are determined according to Equation 1 described above.

As described above, the thickness of the organic light emitting layer 542 in a region corresponding to the inclined surface 541ca of each convex part 541c may be relatively thinner than the part of the thickness of the organic light emitting layer 542 adjacent to the top 541cb of the convex part 541c or the second connection part 541d.

The thickness of the organic light emitting layer 542 in a region corresponding to the inclined surface 541ca of each convex part 541c being relatively thin may result in an efficient light emitting region in which electric fields are locally concentrated. When the organic light emitting diode 540 is driven, electric fields are locally concentrated in the efficient light emitting region, and a main current path is formed to generate the main light emission.

In one embodiment, T3 is a value of T1 reduced by 15%-50%, T2 reduced by 15%-50%, or T4 reduced by 15%-50%. When T3 is T1 (or T2, or T4) reduced by less than 15%, light emission quantity is not enhanced significantly. On the other hand, when T3 is T1 (or T2, or T4) reduced by more than 50%, light emission quantity may be significantly enhanced but the organic light emitting layer 542 is so thin that the life of the organic light emitting device 100 may be deteriorated. Therefore, the organic light emitting layer 542 is made to have a thickness of T3 thinner than T1 or T2 or T4 by a modest amount (i.e., T1 or T2 or T4 reduced by 15%-50%) to achieve enhancement of light emission and life of the organic light emitting device at the same time.

In view of the light emission quantity of the organic light emitting layer 542 depending on the thicknesses (T1, T2, T3, etc.) of the organic light emitting layer 542, which is perpendicular to the first electrode 541, the light emission quantity per unit area of the organic light emitting layer 542 in the inclined surface 541ca between the convex part 541c and the second connection part 541d of the first electrode 541 may be larger than the light emission quantity per unit area of the organic light emitting layer 542 in the top 541cb of the convex part 541c or the second connection part 541d.

Figure 12:
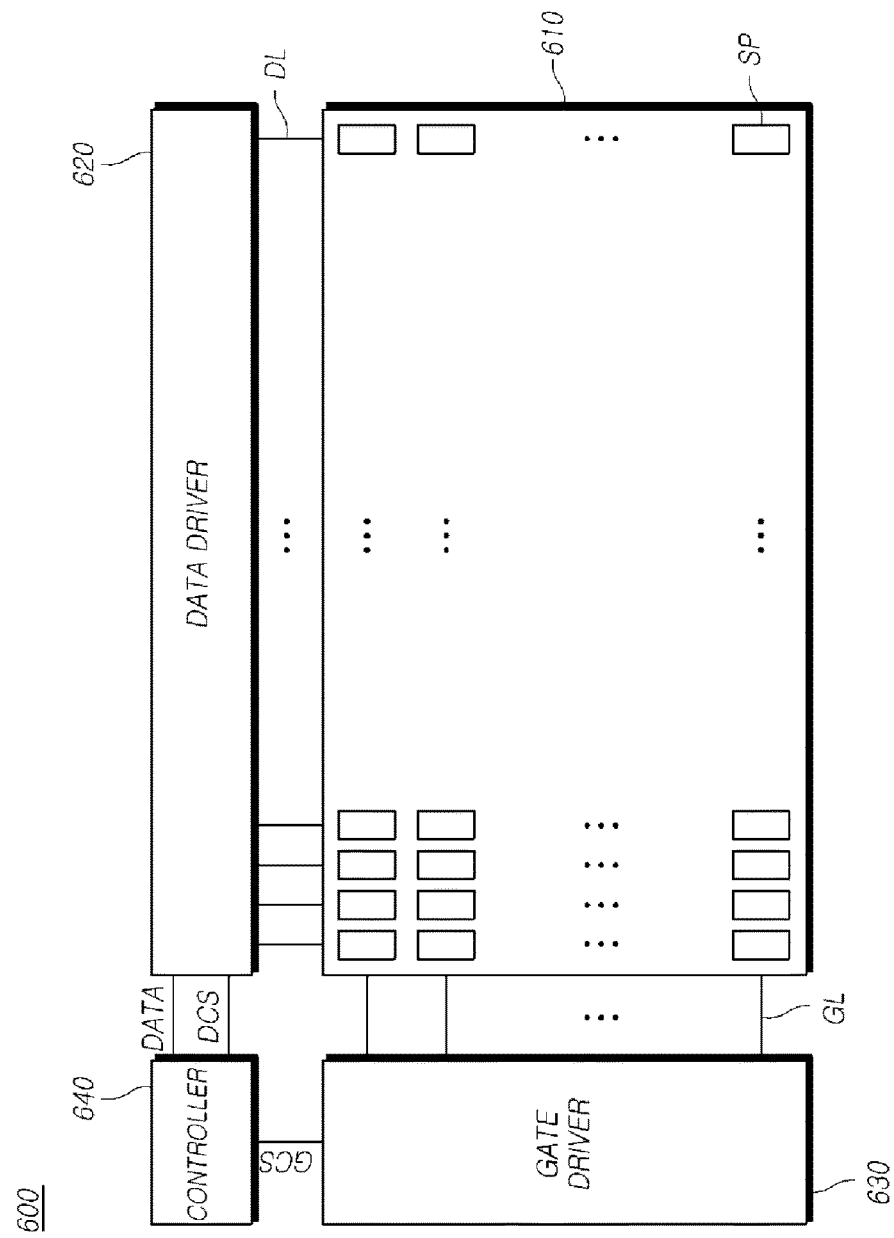
FIG. 12 is a view briefly illustrating an organic light emitting display device in a case where the organic light emitting device according to the exemplary embodiments is an organic light emitting diode display device.

FIG. 12 is a view briefly illustrating an organic light emitting display device in a case where the organic light emitting device according to the exemplary embodiments is an organic light emitting diode display device.

Referring to FIG. 12, an organic light emitting diode display panel 600 according to the exemplary embodiments includes: an organic light emitting display panel 610 in which a plurality of data lines DL and a plurality of gate lines GL are disposed, and a plurality of subpixels SP are disposed in a matrix type; a data driver 620 configured to drive the plurality of data lines by supplying a data voltage to the plurality of data lines; a gate driver 630 configured to sequentially drive the plurality of gate lines by sequentially supplying a scan signal to the plurality of gate lines; and a controller 640 configured to control the data driver 620 and the gate driver 630.

Figure 13:
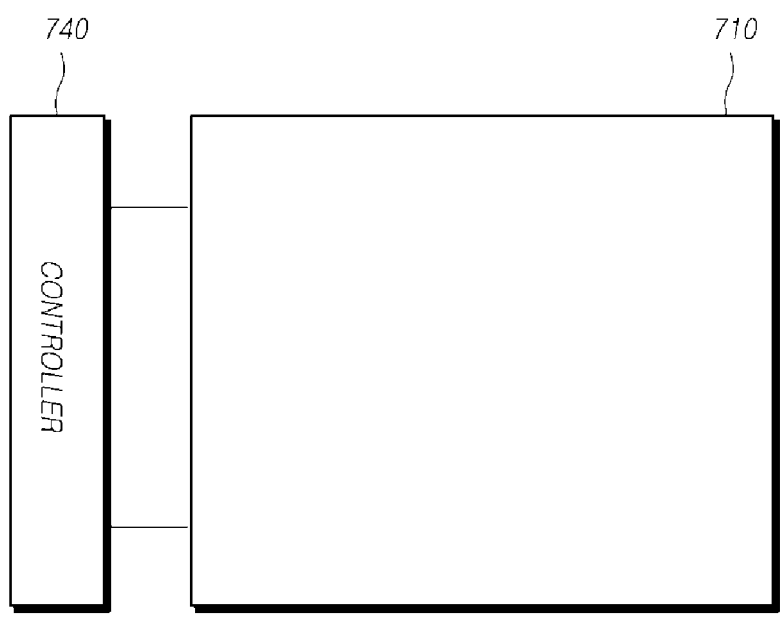
FIG. 13 is a view briefly illustrating a lighting device in a case where the organic light emitting device according to the exemplary embodiments is a lighting device.

FIG. 13 is a view briefly illustrating a lighting device in a case where the organic light emitting device according to the exemplary embodiments is a lighting device.

Referring to FIG. 13, a lighting device 700 according to exemplary embodiments includes a lighting unit 710, a controller 740 that controls the lighting unit 710, and the like. The lighting device 700 may separately include a driver like the organic light emitting display device 600, but is not limited thereto.

In the case where the organic light emitting device is a lighting device 700, as described above, it may be an indoor or outdoor lighting device, a vehicular lighting device, or the like, or may be combined with another mechanical member to be applied to the above-described lighting devices.

FIG. 13 illustrates the organic light emitting device according to exemplary embodiments as a lighting device 700. However, without being limited thereto, the organic light emitting device may be, for example, a light source.

According to the above-described exemplary embodiments, an organic light emitting diode and an organic light emitting device can improve external light extraction efficiency by applying a concave or convex structure to the first electrode.

According to the above-described exemplary embodiments, an organic light emitting diode and an organic light emitting device can improve an outward light emitting efficiency and reduce power consumption.

According to the above-described exemplary embodiments, it is possible to increase the lifetime of an organic light emitting diode and an organic light emitting device.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. An organic light emitting device comprising:
a substrate;
one or more insulation layers on the substrate, the one or more insulation layers having a flat top surface;
a first electrode of a single layer directly on the flat top surface of the one or more insulation layers, the first electrode including a concave part or a convex part, and the concave part of the convex part directly contacting the flat top surface of the one or more insulation layers;
an organic light emitting layer disposed on the first electrode; and
a second electrode disposed on the organic light emitting layer.

2. The organic light emitting device of claim 1, wherein:
the concave part or the convex part includes a concave bottom or a convex top, respectively, and one or more inclined side surfaces, and
a first thickness of the organic light emitting layer adjacent to said one or more of the inclined side surfaces is thinner than a second thickness of the organic light emitting layer adjacent to the concave bottom or the convex top.

3. The organic light emitting device of claim 2, wherein the first thickness is thinner than the second thickness by 15%-50% of the second thickness.

4. The organic light emitting device of claim 1, wherein an inclined side surface of the concave part or the convex part of the first electrode forms an acute angle with a bottom surface or a top surface, respectively, of the concave part or the convex part, respectively, of the first electrode.

5. The organic light emitting device of claim 4, wherein the acute angle ranges from 15 degrees to 70 degrees.

6. The organic light emitting device of claim 4, wherein the organic light emitting layer has a thickness that is thinnest on the inclined side surface of the first electrode.

7. The organic light emitting device of claim 6, wherein a first thickness of the organic light emitting layer on the inclined side surface of the first electrode is thinner than a second thickness of the organic light emitting layer on the bottom surface or the top surface of the concave part or the convex part, respectively, of the first electrode, by 15%-50% of the second thickness.

8. The organic light emitting device of claim 1, wherein the organic light emitting layer and the second electrode are arranged following a shape of a top surface of the first electrode.

9. The organic light emitting device of claim 1, wherein the first electrode includes an amorphous metal oxide.

10. The organic light emitting device of claim 9, wherein the amorphous metal oxide includes any one selected from a group consisting of Indium Zinc Oxide (IZO), Zinc Tin Oxide (ZTO), $SnO_2$ (tin oxide), ZnO (zinc oxide), $In_2O_3$ (indium oxide), Gallium Indium Tin Oxide (GITO), Indium Gallium Zinc Oxide (IGZO), Zinc Indium Tin Oxide (ZITO), Indium Gallium Oxide (IGO), $Ga_2O_3$ (gallium oxide), Aluminum Zinc Oxide (AZO), and Gallium Zinc Oxide (GZO).

11. The organic light emitting device of claim 1, wherein the first electrode includes the concave part together with another concave part and a connection part that is disposed between the concave part and said another concave part to surround the concave part and said another concave part.

12. The organic light emitting device of claim 11, wherein the connection part is flat.

13. The organic light emitting device of claim 1, further comprising:
a thin film transistor on the substrate,
wherein the one or more insulation layers are disposed on the thin film transistor, and the first electrode is electrically connected to the thin film transistor through the one or more insulation layers.

14. The organic light emitting device of claim 13, further comprising a color filter disposed in the one or more insulation layers to overlap with at least a part of the organic light emitting layer.

15. The organic light emitting device of claim 13, wherein a concave bottom of the concave part is in contact with the one or more insulation layers.

16. The organic light emitting device of claim 13, wherein a concave bottom of the concave part is flat.

17. The organic light emitting device of claim 1, wherein the concave part or the convex part has a three-dimensionally tapered shape and has a cross-section of one of a circular shape, a hemispherical shape, a semi-ellipsoidal shape, a square shape, and a hexagonal shape.

18. The organic light emitting device of claim 1, wherein the organic light emitting layer contacts the one or more insulation layers in the concave part of the convex part.

* * * * *